United States Patent
Piret et al.

(10) Patent No.: US 7,502,988 B2
(45) Date of Patent: Mar. 10, 2009

(54) DECODING AND ERROR CORRECTION FOR ALGEBRAIC GEOMETRIC CODES

(75) Inventors: Philippe Piret, Cesson-Sevigne (FR); Frédéric Lehobey, Rennes (FR); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 548 days.

(21) Appl. No.: 11/067,067

(22) Filed: Feb. 25, 2005

(65) Prior Publication Data

US 2005/0204268 A1 Sep. 15, 2005

(30) Foreign Application Priority Data

Feb. 27, 2004 (FR) .................................... 0402033

(51) Int. Cl.
*H03M 13/00* (2006.01)

(52) U.S. Cl. ........................ 714/784; 714/756

(58) Field of Classification Search .......... 714/781–785
See application file for complete search history.

(56) References Cited

U.S. PATENT DOCUMENTS

| | | | | |
|---|---|---|---|---|
| 5,535,140 | A * | 7/1996 | Iwamura ...................... | 701/99 |
| 5,905,739 | A | 5/1999 | Piret et al. ................ | 371/37.01 |
| 6,543,021 | B1 | 4/2003 | Piret ........................... | 714/752 |
| 6,578,170 | B1 | 6/2003 | Piret et al. .................. | 714/758 |
| 6,578,171 | B1 | 6/2003 | Braneci et al. .............. | 714/786 |
| 6,634,007 | B1 * | 10/2003 | Koetter et al. ............... | 714/784 |
| 6,638,318 | B1 | 10/2003 | Piret et al. ................... | 718/781 |
| 6,766,489 | B1 | 7/2004 | Piret et al. ................... | 714/755 |
| 6,877,125 | B2 | 4/2005 | Le Bars et al. .............. | 714/755 |
| 6,898,251 | B2 | 5/2005 | Le Bars et al. .............. | 375/295 |
| 2002/0071496 | A1 | 6/2002 | Ehrmann ..................... | 375/295 |
| 2002/0099997 | A1 | 7/2002 | Piret ........................... | 714/781 |
| 2003/0177430 | A1 | 9/2003 | Piret .......................... | 714/751 |
| 2004/0117719 | A1 | 6/2004 | Lehobey et al. ............. | 714/781 |
| 2004/0194006 | A1 | 9/2004 | Piret et al. ................... | 714/781 |
| 2005/0015704 | A1 | 1/2005 | Piret et al. ................... | 714/781 |
| 2005/0138533 | A1 | 6/2005 | Le Bars et al. ............. | 714/784 |
| 2005/0188291 | A1 | 8/2005 | Piret et al. ................... | 714/752 |

(Continued)

FOREIGN PATENT DOCUMENTS

EP 1 434 132 A 6/2004

OTHER PUBLICATIONS

Gui-Liang Feng & T.R.N. Rao, "Decoding Algebraic-Geometric Codes up to the Designed Minimum Distance", IEEE Transactions on Information Theory, vol. 39, No. 1, Jan. 1993.

(Continued)

*Primary Examiner*—Guy J Lamarre
(74) *Attorney, Agent, or Firm*—Fitzpatrick, Cella, Harper & Scinto

(57) ABSTRACT

A method of decoding a one-point algebraic geometric code defined on an algebraic curve of the kind C(a,b), represented by an equation of degree b in X and of degree a in Y. For any received word, transmission errors affecting the received word are located. The correction of errors in the word, which belongs to an algebraic geometric code, is then reduced to the correction of errors in a certain number, at most equal to a, of words belonging to a Reed-Solomon code. Devices and apparatuses adapted to implement this method are also described.

17 Claims, 2 Drawing Sheets

U.S. PATENT DOCUMENTS

2005/0257115 A1   11/2005   Piret et al. ............... 714/785

OTHER PUBLICATIONS

Van Lint, "Alegbraic Geometric Codes", in "Coding Theory and Design Theory", 1st Part, *The IMA Volumes in Mathematics and Its Applications*, vol. 20, Springer-Verlag, Berlin, 1990.

Little, "A Key Equation and the Computation of Error Values for Codes from Order Domains", Online, http://www.arXiv.org/abs/math.AC/0303299, pp. 1-25, Apr. 2003.

Hasan et al., "Algorithms and Architectures for the Design of a VLSI Reed-Solomon Codec", Reed-Solomon Codes and their Applications, pp. 60-107, 1994.

Hoeholdt et al., "On the Decoding of Algebraic-Geometric Codes", IEEE Transactions on Information Theory, vol. 41, No. 6, pp. 1589-1614, Nov. 1995.

Skorobogatov et al., "On the Decoding of Algebraic-Geometric Codes", IEEE Transactions on Information Theory, vol. 36, No. 6, pp. 1051-1060, Sep. 1990.

Sakata et al., "Generalized Berlekamp-Massey Decoding of Algebraic-Geometric Codes up to Half the Feng-Rao Bound", IEEE Transactions on Information Theory, vol. 41, No. 6, pp. 1762-1768, Nov. 1995.

Leonard, "A Generalized Forney Formule for Algebraic-Geometric Codes", IEEE Transactions on Information Theory, vol. 42, No. 4, pp. 1263-1268, Jul. 1996.

Koetter, "A Forney Type Formula for the Determination of Error Values for Hermitian Codes", Algebraic Decoding of Algebraic-Geometric and Cyclic Codes, dissertation No. 419, Linkoping University, http://tesla.csl.uiuc.edu/{koetter/publications.html, pp. 147-159, 1996.

van Lint, "Algebraic Geometry Codes", Introduction to Coding Theory 3rd Edition, Chapter 10, Springer Verlag, pp. 148-165, 1999.

Sullivan, "A Generalization of the Berlekamp-Massey-Sakata Algorithm", Online, http://www-rohan.sdsu.edu/{mosulliv/Papers/bmsalg6.ps.gz, pp. 1-25, Jun. 15, 2001.

R.E. Blahut, "Theory and Practice of Error-Control Codes", Addison-Wesley, Reading, MA, Chapter 7, pp. 162-193, 1983.

Hoholdt et al., "Handbook of Coding Theory", Elsevier Science B.V., Chapter 10, pp. 871-961, 1998.

Justesen, J., et al., "Fast Decoding of Codes from Algebraic Plane Curves", IEEE Trans. on Information Theory, vol. 38, No. 1, pp. 111-119, Jan. 1992.

Miura, S., "Linear Codes on Affine Algebraic Curves", Trans. of the Institute of Electronics, Information and Communication Engineers, vol. J81-A, No. 10, pp. 1398-1421, Oct. 1998.

Kotter, R., "Fast Generalized Minimum-Distance Decoding of Algebraic-Geometry and Reed-Solomon Codes", IEEE Trans. on Information Theory, vol. 42, No. 3, May 1996.

\* cited by examiner

DECODING AND ERROR CORRECTION FOR ALGEBRAIC GEOMETRIC CODES

This application claims priority from French patent application No. 0402033 filed on Feb. 27, 2004, which is incorporated herein by reference.

FIELD OF THE INVENTION

The present invention concerns systems for communication or recording of data in which the data are subjected to a channel encoding in order to improve the fidelity of the transmission or storage. It concerns more particularly a decoding method, as well as the devices and apparatuses adapted to implement this method.

BACKGROUND OF THE INVENTION

It will be recalled that channel "block encoding" consists, when the "codewords" sent to a receiver or recorded on a data carrier are formed, of introducing a certain level of redundancy in the data. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $v=(v_1, v_2, \ldots, v_n)$. The set of codewords obtained when each information symbol takes some value in the alphabet constitutes a sort of dictionary referred to as a "code" of "dimension" k and "length" n.

When the size q of the "alphabet" is a power of a prime number, the alphabet can be given the structure of what is known as a "Galois field", denoted $F_q$, of which the non-zero elements may conveniently be identified as each being equal to $\gamma^i$ for a corresponding value of i, where $i=1, \ldots, q-1$, and where $\gamma$ is a primitive $(q-1)^{th}$ root of unity in $F_q$.

In particular, certain codes, termed "linear codes" are such that any linear combination of codewords (with the coefficients taken from the alphabet) is still a codeword. These codes may conveniently be associated with a matrix H of dimension (n−k)×n, termed "parity-check matrix": a word v of given length n is a codeword if, and only if, it satisfies the relationship: $H \cdot v^T = 0$ (where the exponent T indicates the transposition); the code is then said to be "orthogonal" to the matrix H.

At the receiver, the associated decoding method then judiciously uses this redundancy to detect any transmission errors and if possible to correct them. There is a transmission error if the difference e between a received word r and the corresponding codeword v sent by the transmitter is non-zero.

More particularly, the decoding is carried out in two main steps.

The first step consists of associating an "associated codeword" with the received word. To do this, the decoder first of all calculates the "error syndromes vector" $s = H \cdot r^T = H \cdot e^T$ of length (n−k) (in the context of the present invention, no difference is made between the term "word" and the term "vector"). If the syndromes are all zero, it is assumed that no transmission error has occurred, and the "associated codeword" will then simply be taken to be equal to the received word. If that is not the case, it is thereby deduced that the received word is erroneous, and calculations are then performed that are adapted to estimate the value of the error e; in other words, these calculations provide an estimated value ê such that (r−ê) is a codeword, which will then constitute the "associated codeword". Usually, this first step of the decoding is divided into two distinct sub-steps: a first so-called "error locating" sub-step, during which the components of the received word are determined of which the value is erroneous, and a second so-called "error correction" sub-step, during which an estimation is calculated of the transmission error affecting those components.

The second step simply consists in reversing the encoding method. In the ideal situation in which all the transmission errors have been corrected, the initial information symbols are thereby recovered.

It will be noted that in the context of the present invention, reference will often be made to "decoding" for brevity, to designate solely the first of those steps, it being understood that the person skilled in the art is capable without difficulty of implementing the second step.

The objective usually given to the decoding is to associate with the received word the codeword situated at the shortest Hamming distance from this received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d−1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

Among known codes, "Reed-Solomon" codes may be cited, which are reputed for their efficiency. They are linear codes, of which the minimum distance d is equal to (n−k+1). The parity-check matrix H of the Reed-Solomon code of dimension k and length n (where n is necessarily equal to (q−1) or to a divisor of (q−1)) is a matrix with (n−k) lines and n columns, which has the structure of a Vandermonde matrix. This parity-check matrix H, which may be defined for example by taking $H_{ij} = \alpha^{i(j-1)}$ ($1 \leq i \leq n-k$, $1 \leq j \leq n$), where $\alpha$ is an $n^{th}$ root of unity in $F_q$; it is then possible to label the component $v_j$, where $1 \leq j \leq n$, of any codeword $v=(v_1, v_2, \ldots, v_n)$ by means of the element $\alpha^{(j-1)}$ of $F_q$; it is for this reason that a set such as $(1, \alpha, \alpha^2, \ldots, \alpha^{n-1})$ is termed "locating set" of the Reed-Solomon code. For certain particular needs, it is also possible to define "extended" or "shortened" Reed-Solomon codes of different length from the "normal" lengths which have just been mentioned. Finally, it is possible to "modify" the Reed-Solomon codes in the following manner: a diagonal matrix P of type n×n, is chosen of which all the diagonal elements are non-zero, and the matrix $H_P = H \cdot P$ is defined, where H is the parity-check matrix for the "standard" Reed-Solomon code defined above; a word belongs to this "modified" code if, and only if, it is orthogonal to $H_P$; the properties of such a modified code are essentially the same as those of the original "standard" code.

As mentioned above, the step of a method of decoding during which a "codeword associated with the received word" is calculated is divided into two sub-steps: the first sub-step is an "error locating" step serving to identify in the received word the components whose value is erroneous; the second sub-step consists then of calculating the corrected value of those erroneous components.

For the decoding of Reed-Solomon codes, as regards error locating, use is usually made of the algorithm known as the "Berlekamp-Massey" algorithm, which will now be briefly described: firstly a matrix S is constructed, termed "syndromes matrix", of which each element is a certain component of the error syndromes vector $s = H \cdot r^T = H \cdot e^T$; next a vector $\underline{\Lambda}$ is sought such that $\underline{\Lambda} \cdot S = 0$, then an "error locating polynomial" $\Lambda(Z)$ is formed of which the coefficients are components of the vector $\underline{\Lambda}$; the inverses of the roots of that polynomial $\Lambda(Z)$ are then, among the elements $\omega_i$ (where $i = 1, \ldots, n$) of the locating set, those which label the erroneous components of the received word r.

As regards the error correction, use is usually made of the algorithm known as the "Formey" algorithm which will now be briefly described. The error calculating polynomial $\Omega(Z) = \Lambda(Z)S(Z)$ modulo $Z^{n-k}$ is constructed, where $$S(Z) = \sum_{i=0}^{n-k-1} s_i Z^i$$

and the $s_i$ are the components of the error syndromes vector s; the errors are then given, for $i = 1, \ldots, n$, by:

$$e_i = \begin{cases} 0 & \text{if } \Lambda(\omega_i^{-1}) \neq 0 \\ -\frac{\Omega(\omega_i^{-1})}{p_i \Lambda'(\omega_i^{-1})} & \text{if } \Lambda(\omega_i^{-1}) = 0 \end{cases},$$

where $\Lambda'(Z)$ designates the derivative of $\Lambda(Z)$, and $p_i$ is equal to 1 for a "standard" Reed-Solomon code and at the diagonal element in position (i,i) of the matrix P for a modified code (see above).

For more details on Reed-Solomon codes, and in particular the algorithms of Berlekamp-Massey and of Formey, reference may for example be made to the work by R. E. Blahut entitled "*Theory and practice of error-control codes*", Addison-Wesley, Reading, Mass., 1983;

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, as indicated above, the length n of the words in Reed-Solomon codes is less than the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes without however requiring a longer alphabet.

In particular so-called "algebraic geometric codes" or "Goppa geometric codes" have recently been proposed (see for example "*Algebraic Geometric Codes*" by par J. H. van Lint, in "*Coding Theory and Design Theory*" $1^{st}$ part, *IMA Volumes Math. Appl.*, volume 21, Springer-Verlag, Berlin, 1990). These codes are constructed from a set of n pairs (x,y) of symbols belonging to a chosen Galois field $F_q$; this set of pairs constitutes the locating set of the algebraic geometric code. In general terms, there is an algebraic equation with two unknowns X and Y such that the pairs (x,y) of that locating set are all solutions of that algebraic equation. The values of x and y of these pairs may be considered as coordinates of "points" $P_j$ (where $j = 1, \ldots, n$) forming an "algebraic curve".

An important parameter of such a curve is its "genus" g. In the particular case where the curve is a simple straight line (the genus g is then zero), the algebraic geometric code reduces to a Reed-Solomon code. For given q and g, certain algebraic curves, termed "maximum", make it possible to achieve a length equal to $(q+2 g\sqrt{q})$, which may be very high; for example, with an alphabet size of 256 and a genus equal to 120, codewords are obtained of length 4096.

In the context of the present invention, a very general class of algebraic geometric codes is concerned: these codes, of which an example described in detail will be found below, are defined on an algebraic curve represented by an equation $f(X,Y) = 0$ with $$f(X,Y) = X^b + cY^a + \Sigma c_{ij} X^i Y^j,$$

where $c \neq 0$ and the $c_{ij}$ are elements of $F_q$, a and b are strictly positive mutually prime integers, and where the sum only applies to the integers i and j which satisfy $ai + bj < ab$. This form of equation is referred to as "C(a,b)". For such a code, a parity-check matrix is conventionally defined in the following manner. With every monomial $Y^t X^u$, where t and u are positive integers or zero, a "weight" is associated (see below for details). If, for an integer $\rho > 0$, there is at least one monomial of which the weight is $\rho$, it is said that $\rho$ is an "achievable" weight. Let $\rho_1 < \rho_2 < \ldots < \rho_{n-k}$ be the (n-k) smallest achievable weights, and let $h_i$ (where $i = 1, \ldots, n-k$) be a monomial of weight $\rho_i$. The element in line i and column j of the parity-check matrix is equal to the monomial $h_i$ evaluated at the point $P_j$ (where, it may be recalled, $j = 1, \ldots, n$) of the algebraic curve. Each point $P_j$ then serves to identify the $j^{th}$ component of any codeword. A code having such a parity-check matrix is termed a "one-point" code since its parity-check matrix is obtained by evaluating (at the n points $P_j$) functions (the monomials $h_i$) which have poles only at a single point, i.e. the point at infinity.

Algebraic geometric codes are advantageous as to their minimum distance d, which is at least equal to (n−k+1−g), and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan entitled "*On the Decoding of Algebraic-Geometric Codes*", IEEE Trans. Inform. Theory, vol. 41 no. 6, pages 1589 to 1614, November 1995). Generally, the higher the genus g of the algebraic curve used, the greater the length of the codewords, but also the greater the complexity of the decoding.

Various error locating algorithms are known for algebraic geometric codes (defined on a curve of non-zero genus).

Such an algorithm, termed "basic" algorithm, has been proposed by A. N. Skorobogatov and S. G. Vlâdut in the article entitled "*On the Decoding of Algebraic-Geometric*

*Codes"*, *IEEE Trans. Inform. Theory*, vol. 36 no. 5, pages 1051 to 1060, November 1990). This algorithm will now be described briefly:

a) a "syndromes matrix" S, of dimension (n−k)×(n−k), is constructed, of which each coefficient $S_{ij}$, where j is less than or equal to a "boundary" value w(i), is equal to a linear combination judiciously chosen of the elements $s_v$ (v=1,2, ... ,n−k) of the syndrome s, the coefficients $S_{ij}$ beyond the boundary remaining indeterminate, b) the system of linear equations is considered $$\sum_{i=1}^{\beta} l_i S_{ij} = 0, \text{ for } j = 1, 2, \ldots, w(\beta),$$

where the unknowns $l_i$ belong to the same alphabet of symbols as the elements of the codewords, and where β is an integer between 1 and (n−k) such that the system permits a non-trivial solution (that is to say a solution in which the coefficients $l_i$ are not all zero), and determining the values of the coefficients $l_i$ corresponding to the smallest possible value of β, which will be denoted λ; and c) calculating the zeros of the "error-locating polynomial"

$$\Lambda(x, y) \equiv \sum_{i=1}^{\lambda} l_i h_i(x, y),$$

these zeros comprising all the pairs (x,y) corresponding to positions of the received word for which the component in that position has suffered a transmission error.

Skorobogatov and Vlâdut have also proposed, in the same article cited above, a "modified" version of the "basic" algorithm, which generally enables a higher number of errors to be corrected that the "basic" algorithm.

Algorithms are also known which operate using an iterative principle: each new iteration of such an algorithm invokes a supplementary component of the syndromes vector $s=H \cdot r^T$.

An example of such an iterative decoding algorithm is disclosed in the article by M. Sakata et al. entitled "*Generalized Berlekamp-Massey Decoding of Algebraic-Geometric Codes up to Half the Feng-Rao Bound*" (IEEE Trans. Inform. Theory, vol 41, pages 1762 to 1768, November 1995) This algorithm can be viewed as a generalization of the Berlekamp-Massey algorithm to algebraic geometric codes defined on a curve of non-zero genus.

Another example of an iterative decoding algorithm has been disclosed by M. O'Sullivan in the article "*A Generalization of the Berlekamp-Massey-Sakata Algorithm*" (preprint 2001).

For any received word r, the set of error locating polynomials defined above associated with the transmission errors affecting that word is termed is termed a "Gröbner ideal". It is possible to generate this Gröbner ideal by means of a finite set of polynomials which constitutes what is known as a "Gröbner basis" of the ideal. The O'Sullivan algorithm which has just been cited produces such a "Gröbner basis" from a matrix S*, of dimension n×n, obtained by "extending" the matrix S (in other words the elements of S and those of S* are identical for j≦w(i) with i≦n−k). This extension is possible each time the number of errors in the received word is less than or equal to (n−k−g)/2.

Thus, when the number of errors in the received word is less than or equal to (n−k−g)/2, it is in general necessary, in order to be able to locate those errors, to know further elements of the syndromes matrix than the elements which we will qualify as "known" due to the fact that they are equal to components of the error syndromes vector $s=H \cdot r^T$ or to simple linear combinations of those components (see the numerical example described below). It is fortunately possible to calculate these elements of "unknown" value by a method comprising a certain number of "majority decisions", for example the algorithm known as the "Feng-Rao" algorithm (see article by G.-L. Feng and T. R. N. Rao entitled "*Decoding Algebraic-Geometric Codes up to the Designed Minimum Distance*>>, IEEE Trans. Inform. Theory, vol. 39, n° 1, January 1993). The object of this algorithm is essentially to extend the matrix S by means of calculation steps having the role of successive iterations. A number of iterations is necessary equal to a certain number g', where g' is at most equal to 2 g, in order to reach the state where, as explained above, it becomes possible to calculate a Gröbner basis from the matrix S* so obtained.

At this stage, it is also possible to calculate additional "unknown" elements of the matrix S* from elements obtained previously, either by means of new iterations of a "majority decisions" algorithm, or more conveniently by means of a certain number of relationships, known as "recursion" relationships, using "feedback polynomials" chosen from the Gröbner basis. In relation to this, reference can be made to the article by Sakata et al. cited above.

In the context of the present invention, it will be said that the elements of the syndromes matrix S* ("known" or "unknown") are "extended error syndromes".

The invention concerns more particularly the sub-step consisting of calculating the corrected value of the erroneous components of the received word; it thus concerns the algorithms adapted to provide an estimated value ê of the transmission error e suffered by the transmitted codeword.

The calculation of errors for algebraic geometric codes is prima facie more complicated than for Reed-Solomon codes. Thus:

the error locating sub-step not only produces one error locating polynomial (denoted above Λ(Z)), but several polynomials, which form a Gröbner basis of the ideal of the error locating polynomials;

these error locating polynomials are polynomials with two variables instead of one; and these error locating polynomials thus possess partial derivatives with respect to those two variables, such that the Formey formula given above, which involves a single derivative, is no longer applicable.

Various error calculating algorithms are known for algebraic geometric codes

The article "Algebraic Geometry Codes", by Tom Høholdt, Jacobus Van Lint and Ruud Pelikaan (Chapter 10 of the "*Handbook of Coding Theory*", North Holland, 1998) constructs the product of certain powers of the polynomials of the Gröbner basis. It then performs a linear combination of those products, allocated with appropriate coefficients. Finally it shows that the value of the polynomial so obtained, taken at the point (x,y) of the locating set is, with the sign being the only difference, the value of the error for the component of the received word labeled by that point (x,y).

The article "*A Generalized Fomey Formula for Algebraic Geometric Codes*" by Douglas A. Leonard (*IEEE Trans. Inform. Theory*, vol. 42, n° 4, pages 1263 to 1268, July 1996), and the article "*A Key Equation and the Computation of Error Values for Codes from Order Domains*" by John B. Little (published on the Internet on Apr. 7, 2003) calculate the values of the errors by evaluating a polynomial with two variables at the common zeros of the error locating polynomials.

These three algorithms are complex to implement, in particular due to the fact that they comprise the multiplication of the two variable polynomials, in addition to formal multiplications in $F_q$.

A simpler algorithm is known from the article "A Formey type formula for the determination of error values for Hermitian codes" by Ralf Kötter (*Algebraic Decoding of Algebraic Geometry and Cyclic Codes*, dissertation No. 419, *Linkoping Studies in Science and Technology*, 1996). However, this algorithm applies solely to the case of the codes constructed on a "hermitian" curve (i.e. a curve represented by the equation $Y^{\sqrt{q}}+Y=X^{1+\sqrt{q}}$ defined over $F_q$, where q is a perfect square).

European patent application No. 03293336.8 in the name of CANON discloses a decoding method adapted in particular to "one-point" algebraic geometric codes defined on an algebraic curve of the kind C(a,b) (see above), and which performs both location and correction of errors.

This method relies on the subdivision of the locating set of the code into subsets which we will term "aggregates". By definition, an "aggregate" groups together the pairs (x,y) of the locating set having a common value of x; these pairs will be denoted $(x,y_p(x))$, where $p=0, \ldots, \lambda(x)-1$ and $\lambda(x)$ is the cardinal of the aggregate considered (naturally, it would be equally possible to define the aggregates and describe the decoding method according to the invention, by swapping the roles of the unknowns X and Y of the equation representing the algebraic curve on which the code is defined). The components of any received word c of length n will then be denoted $c(x,y_p(x))$ when it is wished to emphasize the aggregate structure, and it will be stated that the components c, indexed for that purpose, which have the same value of x form an "aggregate of components" of the word c.

Let m be the maximum weight of the monomials defining the lines of the parity-check matrix (see above). According to application No. 03293336.8, these monomials are classified in sets of monomials $$M_j=\{Y^jX^i | 0 \leq i \leq (m-bj)/a\}$$

for $j \geq 0$, $j<a$, and $j \leq (m/b)$. The cardinal of this set $M_j$ is thus:

$$t(j)=1+\text{INT}\ [(m-bj)/a],$$

and the maximum value of j, denoted $j_{max}$, satisfies:

$$n-k=\sum_{j=0}^{j_{max}} t(j).$$

Let $x_1, x_2, \ldots, x_\mu$ denote the different values of x in the locating set, and $$v=[v(x_1,y_0(x_1)), \ldots, v(x_1,y_{\lambda_1-1}(x_1)), \ldots, v(x_\mu,y_{\lambda_\mu-1}(x_\mu))],$$

denote any particular codeword for each aggregate attached to one of the values $x_1, x_2, \ldots, x_\mu$ of x, there are constructed $(j_{max}+1)$ "aggregate symbols"

$$v_j(x) \equiv \sum_{p=0}^{\lambda(x)-1} [y_p(x)]^j v(x, y_p(x))$$

for $j=0, \ldots, j_{max}$. These aggregate symbols serve to form $(j_{max}+1)$ "aggregate words"

$$v_j=[v_j(x_1), v_j(x_2), \ldots, v_j(x_\mu)],$$

of length $\mu$.

It is easily verified that the condition of belonging to the algebraic geometric code (i.e. $H \cdot v^T=0$) is equivalent to the set of $(j_{max}+1)$ equations:

$$H^{t(j)} \cdot v_j^T=0,$$

where the function t(j) is given above and is, by definition, $$H^t = \begin{bmatrix} 1 & 1 & \ldots & 1 \\ x_1 & x_2 & \ldots & x_\mu \\ \vdots & \vdots & \vdots & \vdots \\ x_1^{t-1} & x_2^{t-1} & \ldots & x_\mu^{t-1} \end{bmatrix}.$$

The advantage of this formulation is that the matrix $H^t$ of the equation is a Vandermonde matrix defined over $F_q$; consequently, if $H^{t(j)}$ is considered as a parity-check matrix defining codewords $v_j$, we have here, for each value of j, a Reed-Solomon code, for which decoding algorithms are known which are simple as well as providing good performance; For example, if a word r has been received, calculation is first made, for $j=0, \ldots, j_{max}$, of the "aggregate received words"

$$r_j=[r_j(x_1), r_j(x_2), \ldots, r_j(x_\mu)],$$

in which, for $x=x_1, x_2, \ldots, x_\mu$, the "aggregate received words" $r_j(x)$ are given by $$r_j(x) = \sum_{p=0}^{\lambda(x)-1} [y_p(x)]^j r(x, y_p(x));$$

next use is made of the Berlekamp-Massey algorithm for locating the erroneous symbols of each word $r_j$, followed by the Formey algorithm for the correction of those erroneous symbols, according to the error syndromes vector $s^j=H^{t(j)} r_j^T$.

Thus, during the error locating steps in the method according to application No. 03293336.8, erroneous aggregates associated with the received word are located, and not individual erroneous components of the received word. Because of this, the number of errors which can be corrected with this method may be less than the theoretical error correction capability of the code (as explained above, that theoretical capability is equal to INT[(d−1)/2], where d is the minimum distance of the algebraic geometric code considered).

SUMMARY OF THE INVENTION

The need is thus shown for an error correction algorithm which is both relatively simple to implement, applicable to all algebraic geometric codes (at least, to those belonging to the very general class of one-point codes defined on an algebraic curve of the kind C(a,b)), and capable of correcting any received word comprising a number of errors less than or equal to the theoretical capability of the code.

According to a first aspect, the invention thus concerns a method of decoding a one-point algebraic geometric code defined on an algebraic curve of the kind C(a,b) represented by an equation of degree b in X and of degree a in Y, said method comprising, for any received word r, a step in which each point (x,y) of the locating set of the code is identified such that the component of said received word r labeled by that point is erroneous. This method is remarkable in that it then comprises the following steps (where the notation $<c_1|c_2>$ represents the scalar product of two words $c_1$ and $c_2$ of length n):

counting the number l of different values of x appearing in those points associated with erroneous components of r, each of those values of x defining an "erroneous aggregate" of which the elements are all the $\lambda(x)$ points $(x, y_p(x))$, where $p=0, \ldots, \lambda(x)-1$, of the locating set corresponding to that value of x, calculating, for $i=0, \ldots, 2l-1$ and $j=0, \ldots, \lambda_{max}-1$, where $\lambda_{max}$ is the maximum value of the cardinals $\lambda(x)$ of the erroneous aggregates, the extended error syndromes $\sigma_j(i)=<Y^jX^i|e>$, where e is the transmission error affecting r and $Y^jX^i$ represents the word of which the components are equal to the value taken by the monomial $Y^jX^i$ at the points of the locating set, implementing, for $j=0, \ldots, \lambda_{max}-1$, by means of the error syndromes polynomial $$S_j(Z) = \sum_{i=0}^{2l-1} \sigma_j(i) Z^i,$$

an error correction algorithm adapted to Reed-Solomon codes, so as to calculate the errors $E_j(x)$ in those of the components of a Reed-Solomon codeword defined over the same Galois field as said algebraic geometric code which are labeled by the l values of x associated with an erroneous aggregate, and calculating, for each value of x such that there is at least one value j for which $E_j(x)$ is non-zero, the estimations $\hat{e}(x, y_p(x))$ of the respective errors in the components $r(x, y_p(x))$, where $p=0, \ldots, \lambda(x)-1$, of r by solving the system of equations $$E_j(x) = \sum_{p=0}^{\lambda(x)-1} [y_p(x)]^j \hat{e}(x, y_p(x)), \text{ where } j = 0, \ldots, \lambda(x) - 1 \quad (1)$$

Thus the method according to the invention comprises calculating the error $E_j(x)$ in the aggregate received symbol $$r_j(x) = \sum_{p=0}^{\lambda(x)-1} [y_p(x)]^j r(x, y_p(x))$$

mentioned above. By virtue of these provisions, the invention essentially reduces the correction of errors in a word belonging to an algebraic geometric code to the correction of errors in $\lambda_{max}$ words belonging to a Reed-Solomon code; in other words, the inventors have managed to replace a complex problem, since involving polynomials with two variables, by a more simple problem involving polynomials with a single variable. However, by contrast to the method according to application No. 03293336.8, the present invention does not give rise to any loss in terms of error correction capability with respect to the theoretical capability of the code, since, on the one hand, the algorithm according to the invention is only implemented after the location of errors has been performed in conventional manner (that is to say after identification of each point (x,y) of the locating set of the code such that the component of said received word r labeled by that point is erroneous), and on the other hand the algorithm according to the invention uses the conventional extended error syndromes, and not error syndromes obtained from aggregate words.

With respect, now, to the known error correction algorithms generally applicable to the algebraic geometric codes considered, the improvement with respect to complexity resulting from the implementation of the invention is significant, despite the necessity to implement an error correction algorithm for Reed-Solomon codes (for example the Formey algorithm) $\lambda_{max}$ times, and to solve for each erroneous aggregate labeled by a value x of X a system of equations (1) of size $\lambda(x)$; it will be noted in this connection that $\lambda_{max}$ is at most equal to a, since, as may be recalled, a represents the exponent of Y in the equation representing the algebraic curve.

It will furthermore be noted that the system of equations (1) is a Vandermonde system: it thus always possesses one, and only one, solution; moreover, as is well known to the person skilled in the art, the solution of this type of system of linear equations is, advantageously, particularly simple.

Thus, when the number of transmission errors affecting the received word is less than or equal to (n–k–g)/2, the estimation provided by the method according to the invention provides the value of the transmission errors with certainty.

According to particular features, if there is at least one value of x associated with an erroneous aggregate such that $\lambda(x)<a$, comparison is then made between the members of at least one equation $$E_j(x) = \sum_{p=0}^{\lambda(x)-1} [y_p(x)]^j \hat{e}(x, y_p(x)), \text{ where } \lambda(x) \le j \le a - 1,$$

associated with said value of x, if need be after having calculated $E_j(x)$ by means of an error correction algorithm adapted to Reed-Solomon codes.

By virtue of these provisions, it will be possible to detect a possible erroneous correction should said at least one equation prove not to be satisfied by the values of $e(x, y_p(x))$ obtained previously.

According to other particular features, said calculation of the extended error syndromes $\sigma_j(i)=<Y^jX^i|e>$ for $i=0, \ldots, 2l-1$ and $i=0, \ldots, \lambda_{max}-1$ comprises the following sub-steps:

calculating, for each value of $j=0, \ldots, \lambda_{max}-1$, a number or extended error syndromes $\sigma_j(i)$ at least equal to said number l of erroneous aggregates, and calculating (if need be) those of the extended error syndromes $\sigma_j(i)$ for $i=0, \ldots, 2l-1$ and $j=0, \ldots, \lambda_{max}-1$ which have not yet been obtained, by means of recursion relationships using the error locating polynomial in x $$\Lambda(Z) = \prod_{t=1}^{l}(1 - Zx_t),$$

where the $x_t$ are said values of x associated with an erroneous aggregate.

By virtue of these provisions, there are obtained (if need be) certain of the extended error syndromes required for the following steps of the method according to the invention, by means of recursion relationships using said polynomial $\Lambda(Z)$, instead of conventional methods such as new iterations of a "majority decisions" algorithm, or, more conveniently, by means of recursions using "feedback polynomials" chosen from the Gröbner basis. Since $\Lambda(Z)$ is a polynomial with one variable whereas the polynomials of the Gröbner ideal have two variables, the present embodiment of the invention makes it possible to significantly reduce the complexity of the calculations for obtaining those extended error syndromes.

The invention also porposes a method of calculating errors in a received word according to an algebraic geometric code defined on an algebraic curve, said method comprising the steps of:

determining a set of valeus of x appearing in points (x,y) associated with erroneous components of the received word, each of those values of x defining an erroneous aggregate;

calculating a predetermined number of extended syndromes associated with the received word;

calculating, for each erroneous aggregate, composite error values using the extended error syndromes, each composite error value representing a linear combination of the errors over the components of said erroneous aggregate; and calcultating the error values over the components of the erroneous aggregates.

According to a second aspect, the invention relates to various devices.

Firstly, it thus concerns an error correction device for the decoding a one-point algebraic geometric code defined on an algebraic curve of the kind C(a,b) represented by an equation of degree b in X and of degree a in Y, said device comprising, for any received word r, means for identifying each point (x,y) of the locating set of the code such that the component of said received word r labeled by that point is erroneous. This device is remarkable in that it also comprises means for:

counting the number l of different values of x appearing in those points associated with erroneous components of r, each of those values of x defining an "erroneous aggregate" of which the elements are all the $\lambda(x)$ points $(x, y_p(x))$, where $p = 0, \ldots, \lambda(x)-1$, of the locating set corresponding to that value of x, calculating, for $i = 0, \ldots, 2l-1$ and $j = 0, \ldots, \lambda_{max}-1$, where $\lambda_{max}$ is the maximum value of the cardinals $\lambda(x)$ of the erroneous aggregates, the extended error syndromes $\sigma_j(i) = \langle Y^j X^i | e \rangle$, where e is the transmission error affecting r and $Y^j X^i$ represents the word of which the components are equal to the value taken by the monomial $Y^j X^i$ at the points of the locating set, implementing, for $j = 0, \ldots, \lambda_{max}-1$, by means of the error syndromes polynomial $$S_j(Z) = \sum_{i=0}^{2l-1} \sigma_j(i) Z^i,$$

an error correction algorithm adapted to Reed-Solomon codes, so as to calculate the errors $E_j(x)$ in those of the components of a Reed-Solomon codeword defined over the same Galois field as said algebraic geometric code which are labeled by the l values of x associated with an erroneous aggregate, and calculating, for each value of x such that there is at least one value j for which $E_j(x)$ is non-zero, the estimations ê(x, $y_p(x)$) of the respective errors in the components $r(x, y_p(x))$, where $p = 0, \ldots, \lambda(x)-1$, of r by solving the system of equations $$E_j(x) = \sum_{p=0}^{\lambda(x)-1} [y_p(x)]^j \hat{e}(x, y_p(x)), \text{ where } j = 0, \ldots, \lambda(x) - 1 \quad (1)$$

Said error correction algorithm for a Reed-Solomon code may for example be the Formey algorithm.

According to particular features, the error correction device comprises means for, if there is least one value of x that is associated with an erroneous aggregate of cardinal $\lambda(x) < a$, comparing next the members of at least one equation $$E_j(x) = \sum_{p=0}^{\lambda(x)-1} [y_p(x)]^j \hat{e}(x, y_p(x)), \text{ where } \lambda(x) \leq j \leq a - 1,$$

associated with said value of x, if need be after having calculated $E_j(x)$ by means of an error correction algorithm adapted to Reed-Solomon codes.

According to other particular features, the error correction device comprises, in order to perform said calculation of the extended error syndromes $\sigma_j(i) = \langle Y^j X^i | e \rangle$ for $i = 0, \ldots, 2l-1$ and $j = 0, \ldots, \lambda_{max}-1$, means for:

calculating, for each value of $j = 0, \ldots, \lambda_{max}-1$, a number or extended error syndromes $\sigma_j(i)$ at least equal to said number l of erroneous aggregates, and calculating (if need be) those of the extended error syndromes $\sigma_j(i)$ for $i = 0, \ldots, 2l-1$ and $j = 0, \ldots, \lambda_{max}-1$ which have not yet been obtained, by means of recursion relationships using the error locating polynomial in x $$\Lambda(Z) = \prod_{t=1}^{l}(1 - Zx_t),$$

where the $x_t$ are said values of x associated with an erroneous aggregate.

The invention also proposes a device for calculating errors in a received word according to an algebraic geometric code defined on an algebraic curve, said device comprising: determination means for determining a set of values of x appearing in points (x,y) associated with erroneous components of the received word, each of those values of x defining an erroneous aggregate; syndrome calculation means for calculating a predetermined number of extended syndromes associated with the received word; first error value calculation eans for calculating, for each erroneous aggregate, composite error values using the extended error syndromes, each composite error value representing a linear combination of the errors over the components of said erroneous aggregate; and second error value calculation means for calculating the error values over the components of the erroneous aggregates.

The advantages of these error correction devices are essentially the same as those of the methods complementary thereto described succinctly above.

The invention also concerns, secondly, a decoder comprising:

at least one error correction device as described succinctly above, and at least one redundancy removal device.

The invention also relates to:

an apparatus for receiving encoded digital signals comprising a decoder as succinctly described above, as well as means for demodulating said encoded digital signals, a computer system comprising a decoder as succinctly described above, and further comprising at least one hard disk, and at least one means for reading that hard disk, a non-removable data storage means comprising computer program code instructions for the execution of the steps of any one of the methods succinctly described above, a partially or wholly removable data storage means comprising computer program code instructions for the execution of the steps of any one of the methods succinctly described above, and a computer program containing instructions such that, when said program controls a programmable data processing device, said instructions lead to said data processing device implementing one of the methods succinctly described above.

The advantages provided by this decoder, this reception apparatus, this computer system, these data storage means and this computer program are essentially the same as those provided by the methods according to the invention.

BRIEF DESCRIPTION OF THE DRAWINGS

Other aspects and advantages of the invention will emerge from a reading of the following detailed description of particular embodiments, given by way of non-limiting example. The description refers to the accompanying drawings, in which.

DETAILED DESCRIPTION OF A PREFERRED EMBODIMENT

Figure 1:
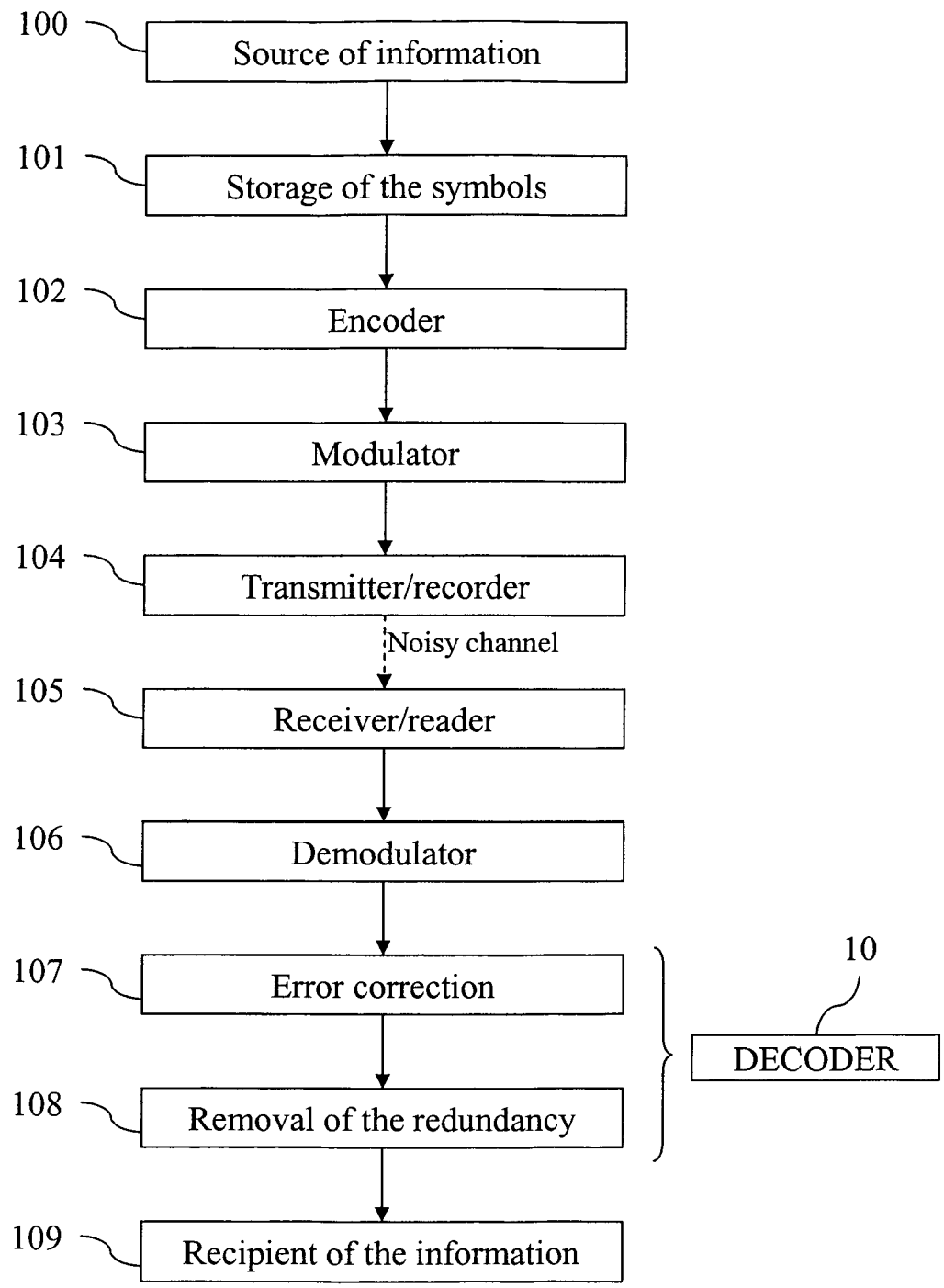
FIG. 1 is a block diagram of a system for transmitting information using a decoder according to the invention.

FIG. 1 is a block diagram of a system for transmitting information using a channel encoding and decoding according to the invention.

The function of this system is to transmit information of any nature from a source 100 to a recipient or user 109. First of all, the source 100 puts this information into the form of symbols belonging to a certain alphabet (for example bytes), and transmits these symbols to a storage unit 101, which accumulates the symbols so as to form sets each containing k symbols. Next, each of these sets is transmitted by the storage unit 101 to an encoder 102 which incorporates the redundancy therein, so as to construct a codeword of length n belonging to the chosen code.

The codewords so formed are next transmitted to a modulator 103, which associates a modulation symbol (for example, a complex amplitude) with each symbol of the codeword. Next, these modulation symbols are transmitted to a transmitter or to a recorder 104, which inserts the symbols in a transmission channel. This channel may for example be constituted by a wired transmission or wireless transmission such as a radio signal, or by storage on an appropriate carrier such as a DVD or a magnetic tape. This transmission arrives at a receiver or a reader 105, after having been affected by a "transmission noise" whose effect is to modify or delete certain of the modulation symbols at random.

The receiver or reader 105 then transmits these symbols to the demodulator 106, which transforms them into symbols of the alphabet mentioned above. The n symbols resulting from the transmission of the same codeword are next grouped together into a "received word" in an error correction unit 107, which implements a decoding method according to the invention, so as to provide an "associated codeword". Next, this associated codeword is transmitted to a redundancy removal unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The method of error correction according to the invention will now be illustrated, with the aid of a numerical example. Note that this example does not necessarily constitute a preferred choice of parameters for the encoding or decoding. It is provided here to enable the person skilled in the art to understand more easily the operation of the method according to the invention.

An algebraic geometric code will thus be considered of dimension 42 and length 60 defined as follows.

The alphabet of the symbols is constituted by the Galois field $F_{16}$. As the cardinal of this field is a power of 2 ($16=2^4$), the sign "+" is equivalent to the sign "−" before any coefficient of a polynomial with coefficients belonging to that field.

The following "algebraic curve" is then considered of genus g=6 constituted by the set of the solutions (X=x,Y=y) of the equation with two unknowns $$Y^4+Y+X^5=0 \qquad (2)$$

over $F_{16}$ (this is a "hermitian" curve, but, as can easily be understood, the application of the invention is in no way limited to this type of geometric equation). It is found that by giving to X some particular value x in $F_{16}$, each time there are 4 values $y_p(x)$ (p=1,2,3,4) in $F_{16}$ such that the pair $(x,y_p(x))$ is a solution of equation (2); these solutions of equation (2) are the coordinates of the "finite points of the curve" (the curve also contains a point at infinity denoted $P_\infty$). It is chosen to constitute the locating set by means of all these solutions except those where x=0; the locating set thus has a cardinal equal to 60, and it can be divided into 15 aggregates which each have a cardinal λ(x) equal to 4. It is recalled that each point $P_j$ of the locating set serves to identify the j-th element of any codeword; the number of such points being here equal to 60, the length n of the code is thus also equal to 60.

Next, the vector space $L(m\,P_\infty)$ is considered of polynomials in X and Y with coefficients in $F_{16}$ of which solely the poles are situated in $P_\infty$ and are of order less than or equal to m, where m is a strictly positive integer (the image of this space of polynomials on the finite points of the curve represented by equation (2) is thus a "one-point" algebraic geometric code). This vector space, which is of dimension greater than or equal to (m−g+1) (equal if m>2g−2), has a base constituted by the monomials $h_i = Y^t X^u$, where t is an integer between 0 and 3, u is a positive integer or zero, 4u+5t<m, and i=1, . . . ,n−k. This quantity $\rho(h_i)=4u+5t$ is usually called the "weight" of the monomial $h_i$.

Take for example: m=23; a set of monomials $h_i$ where i=1, . . . ,18 is then obtained since:

$$m-g+1=23-6+1=18.$$

The monomials $h_i$ may be classified into ordered subsets of monomials $$M_t = \{Y^t X^u | 0 \leq u \leq (23-5t)/4\},$$

where: $0 \leq t \leq 3$. These ordered subsets of monomials are explicitly:

$$M_0 = \{1, X, X^2, X^3, X^4, X^5\},$$

$$M_1 = \{Y, YX, YX^2, YX^3, YX^4\},$$

$$M_2 = \{Y^2, Y^2X, Y^2X^2, Y^2X^3\}, \text{ and}$$

$$M_3 = \{Y^3, Y^3X, Y^3X^2\}.$$

It is verified that the total number of monomials $h_i$ really is equal to: 6+5+4+3=18.

Finally, the parity-check matrix H of the code is defined in the following manner: the element in line i and column j of that matrix is equal to the value taken by the monomial $h_i$ at the point $P_j$ of the algebraic curve. Thus, n−k=18, and so k=42. The minimum distance d of this code is at least equal to n−k+1−g=13. It is thus possible to correct at least INT[(13−1)/2]=6 symbols having suffered a transmission error.

A summary will now be given of the manner in which, when an algebraic geometric code has been chosen and a codeword has been transmitted, the syndromes matrix S* is constructed in conventional manner for the corresponding received word.

Consider the weights $\rho(Y^t X^u)=4u+5t$ less than or equal to (n+g). For each accessible weight value, a particular monomial $Y^t X^u$ is chosen. The lines and columns of the matrix S* are then indexed by the series of chosen monomials, in order of increasing weight.

The element, denoted $\sigma_{t+\tau}(u+\upsilon)$, of the matrix S* situated at the line indexed by $Y^\tau X^u$ and at the column indexed by $Y^\tau X^\upsilon$ is taken equal to $$\sigma_{t+\tau}(u+\upsilon)=<Y^{t+\tau}X^{u+\upsilon}|e>.$$

In other words, to obtain an element of that matrix, it is necessary to calculate the scalar product of the error e affecting the received word by the word of which the components are equal to the value taken at the points of the locating set by the monomial corresponding to that matrix element.

If the weight of this monomial is less than or equal to m, the matrix element sought is, taking account of the algebraic equation (2) and of the sequence of monomials $h_i$ chosen for the parity-check matrix H, either a component $s_i=<h_i|e>$ (where i=1, . . . ,n−k) of the error syndromes vector $s=H \cdot e^T$ (thus in our example, $<YX^3|e>=s_{10}$), or a linear combination of components of the error syndromes vector (thus in our example $<Y^4|e>=<Y|e>+<X^5|e>=s_7+s_6$), The matrix elements so obtained are those possessed in common by the syndromes matrices S and S*. To calculate the matrix elements of S* of which the weight ρ satisfies m<ρ≦m+g', where g' is an integer between g and 2 g, an iterative method is used comprising a certain number of "majority decisions", such as the Feng-Rao algorithm mentioned above. Next it is possible to obtain elements of matrix S* of weight ρ>m+g' from elements obtained previously, either by means of new iterations of a "majority decisions" algorithm, or more conveniently by means of recursions using "feedback polynomials" chosen from the Gröbner basis.

An error correction method according to the invention will now be illustrated by means of a numerical example applied to the code, presented above, of length 60 and dimension 42 defined on an algebraic curve of genus g=6 over $F_{16}$. For this, let the choice of primitive element of $F_{16}$ be a root α of the equation $$Z^4+Z+1=0.$$

Suppose a word r is received producing the following error syndromes vector (of n−k=18 components):

$$s = H \cdot r^T =$$
$$[\alpha^2 \alpha^2 \alpha^6 \alpha^2 \alpha^{13} \alpha^7 \alpha^6 0 \alpha^3 \alpha^{13} \alpha \alpha^9 \alpha^{10} \alpha^{10} \alpha^5 \alpha^8 \alpha^8 0]^T \quad (3)$$

By means of a "majority decisions" algorithm, the following 2 g=12 "unknown" error syndromes are obtained:

$$\sigma_0(6) = <X^6|e> = 0, \sigma_0(7) = <X^7|e> = \alpha^6, \sigma_0(8) = <X^8|e> = \alpha^{14},$$

$$\sigma_1(5) = <YX^5|e> = \alpha^{14}, \sigma_1(6) = <YX^6|e> = \alpha^8, \sigma_1(7) = <YX^7|e> = \alpha^{12},$$

$$\sigma_2(4) = <Y^2X^4|e> = \alpha^{14}, \sigma_2(5) = <Y^2X^5|e> = \alpha, \sigma_2(6) = <Y^2X^6|e> = \alpha,$$

$$\sigma_3(3) = <Y^3X^3|e> = 0, \sigma_3(4) = <Y^3X^4|e> = \alpha^9, \sigma_3(5) = <Y^3X^5|e> = 0,$$

In this case, on the basis of these 18+12=30 "extended" syndromes, an error locating algorithm (for example the O'Sullivan algorithm cited above) is capable of producing the following three Gröbner ideal generators:

$$G_1(X,Y) = \alpha^{14}X^2 + \alpha^5 YX + \alpha^2 X + Y^2 + \alpha^3 Y + \alpha^6,$$

$$G_2(X,Y) = \alpha^3 X^3 + YX^2 + \alpha^{14}X^2 + \alpha^{14}YX + X + \alpha^8 Y + \alpha^6, \text{ and}$$

$$G_3(X,Y) = X^4 + \alpha^{12}X^3 + \alpha^6 YX^2 + \alpha^7 X^2 + \alpha^3 YX + \alpha^2 X + Y + \alpha^4.$$

These three generators have 6 zeros in common: $(1, \alpha^8), (\alpha, \alpha^9), (\alpha^5, \alpha^3), (\alpha^7, \alpha^9), (\alpha^7, \alpha^{13})$, and $(\alpha^{14}, \alpha^{14})$.

which label the erroneous components of the received word r.

Up to here, the calculations have been performed in conventional manner. At this stage, according to the invention, the "erroneous aggregates" are identified, that is to say the aggregates of which at least one element is erroneous: by inspection of the positions of errors which have just been calculated, it is found that the erroneous aggregates are labeled by following the l=5 values of x:

$$x_1=1, x_2=\alpha, x_3=\alpha^5, x_4=\alpha^7, \text{ and } x_5=\alpha^{14}.$$

These aggregates are of cardinal 4 (as in this case in fact are all the aggregates of the locating set) and consequently $\lambda_{max}=4$.

According to the invention, for each value of j from 0 to a−1=3, an algorithm is now implemented which is adapted to provide the value of the errors, with respect to a certain word of a Reed-Solomon code, of which the position in that word is labeled by the 5 values of x which have just been determined. Naturally, this Reed-Solomon code is assumed to be defined over $F_{16}$ as the algebraic geometric code considered.

To do this, it is necessary to know the value of the extended error syndromes $\sigma_j(i) = <Y^j X^i|e>$ for i from 0 to 2l−1=9.

Those among these extended error syndromes which have not yet been obtained (it is easy to check that there are 10 of them) can conventionally be calculated using the generators $G_1(X,Y)$, $G_2(X,Y)$, and $G_3(X,Y)$ used as "feedback polynomials". This calculation is however rather tedious.

In the present embodiment of the invention, a faster method is used to calculate these 10 extended error syndromes.

It is found in the present case that, for each value of j from 0 to $\lambda_{max}-1=3$, the value is known of a number of extended error syndromes $\sigma_j(i)$ at least equal to the number l of erroneous aggregates, i.e. 5 in the example considered. It is then possible to calculate the 10 extended error syndromes still required, by recursions using the "polynomial for locating errors in x"

$$\Lambda(Z) = (1-Z)(1-\alpha Z)(1-\alpha^5 Z)(1-\alpha^7 Z)(1-\alpha^{14} Z)$$
$$= 1 + \alpha^{10} Z + \alpha^{11} Z^2 + \alpha^5 Z^3 + Z^4 + \alpha^{12} Z^5,$$

of the error locating type polynomial provided by the conventional algorithms (for example the Berlekamp-Massey algorithm) adapted to Reed-Solomon codes. It is clear that the recursions using the polynomial with one variable $\Lambda(Z)$ are much simpler than the recursions using the polynomials $G_1(X,Y)$, $G_2(X,Y)$, and $G_3(X,Y)$ with two variables.

The following is thus obtained:

$\sigma_0(9)=<X^9|e>=\alpha$, $\sigma_1(8)=<YX^8|e>=\alpha^9$, $\sigma_1(9)=<YX^9|e>=0$, $\sigma_2(7)=<Y^2X^7|e>=\alpha^{12}$, $\sigma_2(8)=<Y^2X^8|e>=\alpha^8$, $\sigma_2(9)=<Y^2X^9|e>=\alpha^{13}$, $\sigma_3(6)=<Y^3X^6|e>=0$, $\sigma_3(7)=<Y^3X^7|e>=\alpha^{14}$, $\sigma_3(8)=<Y^3X^8|e>=0$, $\sigma_3(9)=<Y^3X^9|e>=\alpha^7$.

According to the invention, the error syndromes polynomials are next formed $$S_j(Z) = \sum_{i=0}^{9} \sigma_j(i) Z^i \text{ (since } 2l-1=9\text{)}.$$

For the correction of the errors $E_j(x)$ affecting a Reed-Solomon codeword, the Formey algorithm could for example be employed, which uses the error calculating polynomials $\Omega_j(Z)=\Lambda(Z)S_j(Z)$ modulo $Z^{10}$ (since $2l=10$)

for j=0,1,2,3. Taking account of the extended syndromes obtained above, these polynomials are explicitly the following:

$S_0(Z)=\alpha^2+\alpha^2 Z+\alpha^6 Z^2+\alpha^{13} Z^4+\alpha^7 Z^5+\alpha^6 Z^7+\alpha^{14} Z^8+\alpha Z^9$, $\Omega_0(Z)=\alpha^2+\alpha^7 Z+\alpha^{11} Z^2+\alpha^{14} Z^4$, $S_1(Z)=\alpha^6+\alpha^3 Z^2+\alpha^{13} Z^3+\alpha Z^4+\alpha^{14} Z^5+\alpha^8 Z^6+\alpha^{12} Z^7+\alpha^{11} Z^8$, $\Omega_1(Z)=\alpha^6+\alpha Z+\alpha^6 Z^2+\alpha^{11} Z^3+\alpha Z^4$, $S_2(Z)=\alpha^9+\alpha^{10} Z+\alpha^{11} Z^2+\alpha^5 Z^3+\alpha^{14} Z^4+\alpha Z^5+\alpha Z^6+\alpha^{12} Z^7+\alpha^8 Z^8+\alpha^{13} Z^9$, $\Omega_2(Z)=\alpha^9+\alpha^2 Z+\alpha^{10} Z^2+\alpha^8 Z^3+\alpha^{12} Z^4$, $S_3(Z)=\alpha^8+\alpha^8 Z+\alpha^9 Z^4+\alpha^{14} Z^7+\alpha^7 Z^9$, and $\Omega_3(Z)=\alpha^8+\alpha^{13} Z+\alpha^7 Z^2+\alpha^{11} Z^3+\alpha Z^4$.

Finally, the error correction algorithm for j=0 gives:

$E_0(1)=1\times\Omega_0(1)/\Lambda'(1)=\alpha^7$, $E_0(\alpha)=\alpha\Omega_0(\alpha^{-1})/\Lambda'(\alpha^{-1})=1$, $E_0(\alpha^5)=\alpha^5\Omega_0(\alpha^{-5})/\Lambda'(\alpha^{-5})=\alpha$, $E_0(\alpha^7)=\alpha^7\Omega_0(\alpha^{-7})/\Lambda'(\alpha^{-7})=\alpha^9$, $E_0(\alpha^{14})=\alpha^{14}\Omega_0(\alpha^{-14})/\Lambda'(\alpha^{-14})=\alpha^5$;

the error correction algorithm for j=1 gives:

$E_1(1)=1\times\Omega_1(1)/\Lambda'(1)=1$, $E_1(\alpha)=\alpha\Omega_1(\alpha^{-1})/\Lambda'(\alpha^{-1})=\alpha^9$, $E_1(\alpha^5)=\alpha^5\Omega_1(\alpha^{-5})/\Lambda'(\alpha^{-5})=\alpha^4$, $E_1(\alpha^7)=\alpha^7\Omega_1(\alpha^{-7})/\Lambda'(\alpha^{-7})=\alpha^{10}$, $E_1(\alpha^{14})=\alpha^{14}\Omega_1(\alpha^{-14})/\Lambda'(\alpha^{-14})=\alpha^4$;

the error correction algorithm for j=2 gives:

$E_2(1)=1\times\Omega_2(1)/\Lambda'(1)=\alpha^8$, $E_2(\alpha)=\alpha\Omega_2(\alpha^{-1})/\Lambda'(\alpha^{-1})=\alpha^3$, $E_2(\alpha^5)=\alpha^5\Omega_2(\alpha^{-5})/\Lambda'(\alpha^{-5})=\alpha^7$, $E_2(\alpha^7)=\alpha^7\Omega_2(\alpha^{-7})/\Lambda'(\alpha^{-7})=\alpha^2$, $E_2(\alpha^{14})=\alpha^{14}\Omega_2(\alpha^{-14})/\Lambda'(\alpha^{-14})=\alpha^3$;

and the error correction algorithm for j=3 gives:

$E_3(1)=1\times\Omega_3(1)/\Lambda'(1)=\alpha$, $E_3(\alpha)=\alpha\Omega_3(\alpha^{-1})/\Lambda'(\alpha^{-1})=\alpha^{12}$, $E_3(\alpha^5)=\alpha^5\Omega_3(\alpha^{-5})/\Lambda'(\alpha^{-5})=\alpha^{10}$, $E_3(\alpha^7)=\alpha^7\Omega_3(\alpha^{-7})/\Lambda'(\alpha^{-7})=\alpha^7$, $E_3(\alpha^{14})=\alpha^{14}\Omega_3(\alpha^{-14})/\Lambda'(\alpha^{-14})=\alpha^2$.

The last step of the method according to the invention consists of grouping together the above results aggregate by aggregate, and of solving the system of equations (1) (of dimension 4) for each aggregate:

for $x_1=1$, knowing that $y_0(1)=\alpha, y_1(1)=\alpha^2, y_2(1)=\alpha^4, y_3(1)=\alpha^8$, it is found that:

$\hat{e}(1,y_0(1))=0, \hat{e}(1,y_1(1))=0, \hat{e}(1,y_2(1))=0,\ \hat{e}(1,y_3(1))=\alpha^7$;

for $x_2=\alpha$, knowing that $y_0(\alpha)=\alpha^6, y_1(\alpha)=\alpha^7, y_2(\alpha)=\alpha^9, y_3(\alpha)=\alpha^{13}$, it is found that:

$\hat{e}(\alpha,y_0(\alpha))=0, \hat{e}(\alpha,y_1(\alpha))=0, \hat{e}(\alpha,y_2(\alpha))=1, \hat{e}(\alpha,y_3(\alpha))=0$;

for $x_3=\alpha^5$, knowing that $y_0(\alpha^5)=\alpha^3, y_1(\alpha^5)=\alpha^{11}, y_2(\alpha^5)=\alpha^{12}, y_3(\alpha^5)=\alpha^{14}$, it is found that:

$\hat{e}(\alpha^5,y_0(\alpha^5))=\alpha, \hat{e}(\alpha^5,y_1(\alpha^5))=0, \hat{e}(\alpha^5,y_2(\alpha^5))=0, \hat{e}(\alpha^5,y_3(\alpha^5))=0$;

for $x_4=\alpha^7$, knowing that $y_0(\alpha^7)=\alpha^6, y_1(\alpha^7)=\alpha^7, y_2(\alpha^7)=\alpha^9, y_3(\alpha^7)=\alpha^{13}$, it is found that:

$\hat{e}(\alpha^7,y_0(\alpha^7))=0, \hat{e}(\alpha^7,y_1(\alpha^7))=0, \hat{e}(\alpha^7,y_2(\alpha^7))=\alpha^{11}, \hat{e}(\alpha^7,y_3(\alpha^7))=\alpha^2;$ and for $x_5 = \alpha^{14}$, knowing that $y_0(\alpha^{14})=\alpha^3, y_1(\alpha^{14})=\alpha^{11}, y_2(\alpha^{14})=\alpha^{12}, y_3(\alpha^{14})=\alpha^{14},$ it is found that:

$\hat{e}(\alpha^{14},y_0(\alpha^{14}))=0, \hat{e}(\alpha^{14},y_1(\alpha^{14}))=0, \hat{e}(\alpha^{14},y_2(\alpha^{14}))=0, \hat{e}(\alpha^{14},y_3(\alpha^{14}))=\alpha^3.$ By using the coordinates indicated above of the points of the algebraic curve belonging to erroneous aggregates, it is easy to check that the word ê of which certain components are given above and the other are zero, is, as desired, such that $s_i = <h_i|\hat{e}>$ for all the components $s_i$ of the error syndromes vector given in (3).

It will be noted that in the numerical example above, after having performed 2 g iterations of the "majority decisions" algorithm, the value is known, for all j, of the l extended error syndromes $\sigma_j(i)$ for i from 0 to l−1=4. It has thus been possible, in this example, to directly follow this decoding step with the calculation according to this embodiment of the invention (i.e. by recursions using the one-variable polynomial $\Lambda(Z)$) of the other required extended error syndromes. However, this is not always the case: this is because it may happen, for certain received words, that after said 2 g iterations, a sufficient number of extended error syndromes is not obtained (i.e. a number l for each value of j) to be able to directly implement the recursions using the polynomial with one variable $\Lambda(Z)$; in such cases, it is necessary to calculate the missing extended error syndrome(s) in order to reach said sufficient number, for example by means of the "majority decisions" algorithm or by means of recursions using the "feedback polynomials" with two variables.

Figure 2:
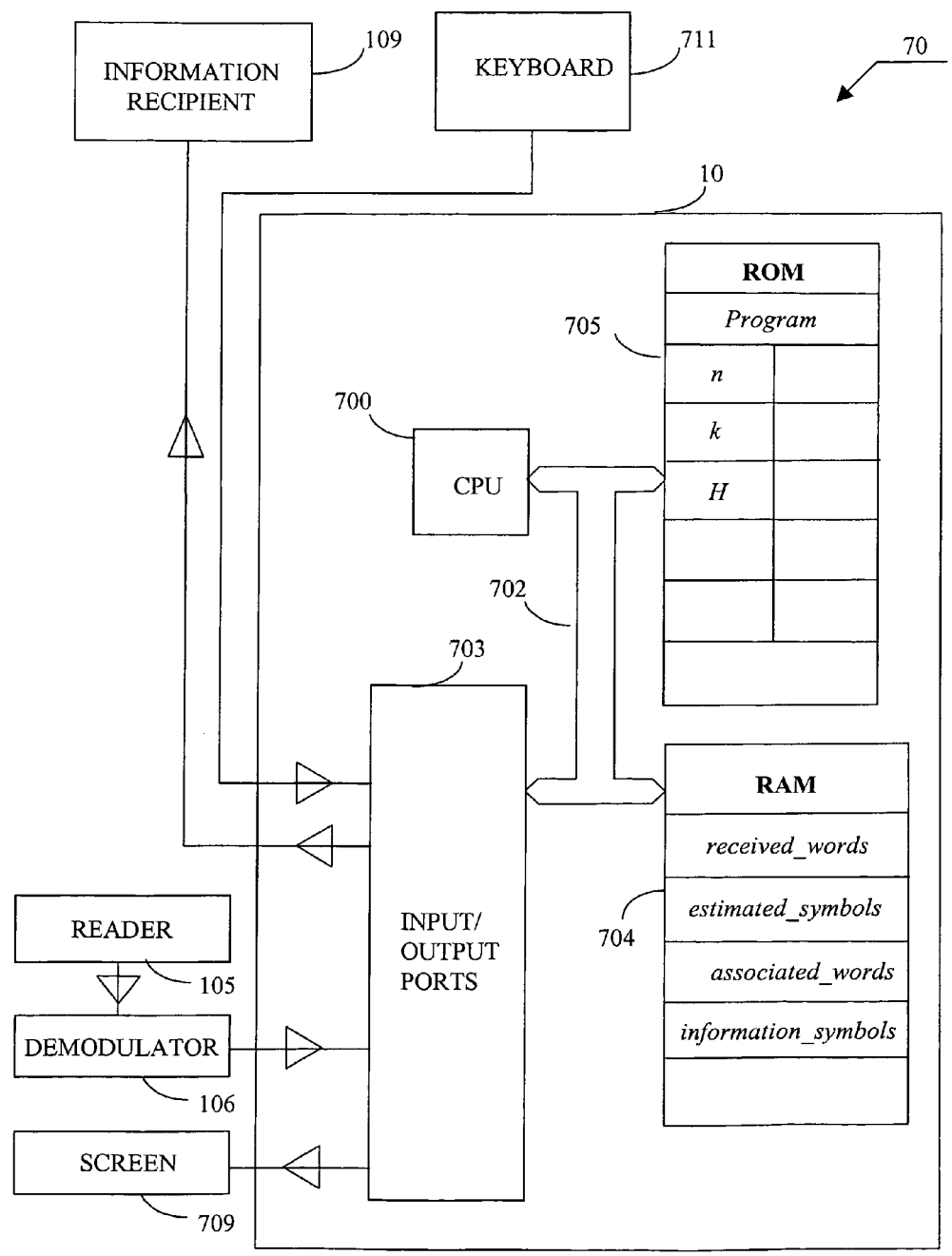
FIG. 2 shows an apparatus for receiving digital signals incorporating a decoder according to the invention.

The block diagram of FIG. 2 represents an apparatus for receiving digital signals 70 incorporating the decoder 10. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:

a central processing unit 700, a random access memory (RAM) 704, read only memory (ROM) 705; and said input/output ports 703.

Each of the elements illustrated in FIG. 2 is well known to the person skilled in the art of microcomputers and mass storage systems and, more generally, of information processing systems. These known elements are therefore not described here. It should be noted, however, that:

the information recipient 109 could be, for example, an interface peripheral, a display, a modulator, an external memory or other information processing system (not shown), and could be adapted to receive sequences of signals representing speech, service messages or multimedia data in particular of the IP or ATM type, in the form of sequences of binary data, the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:

registers "received_words", in which the received words are kept, a register "estimated_symbols", in which are stored the symbols from a received word in course of correction, a register "associated_words", in which are stored the symbols of the "associated codewords", and a register "information_symbols", in which are stored the symbols resulting from the redundancy removal.

The read only memory 705 is adapted to store, in registers which, for convenience, have the same names as the data which they store:

the operating program of the central processing unit 700, in a register "program", the length of each codeword in a register "n", the number of information symbols in each code word, in a register "K", and a table containing each word $Y^j X^i$ of which the components are equal to the value taken by the monomial $Y^j X^i$ at the points of the locating set, for i=0, . . . ,2L−1 and j=0, . . . ,$\Lambda_{max}$−1, where L is the total number of aggregates and $\Lambda_{max}$ is the size of the maximum aggregate, in a register "W".

An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

What is claimed is:

1. A method of decoding a one-point algebraic geometric code defined on an algebraic curve of the kind C(a,b) represented by an equation of degree b in X and of degree a in Y, said method comprising, for any received word r, a step of identifying each point (x,y) of a locating set of a code such that a component of said received word r labeled by that point is erroneous, the method comprising the following steps:

counting the number l of different values of x appearing in the points associated with erroneous components of r, each of the values of x defining an erroneous aggregate of which the elements are all the $\lambda(x)$ points $(x,y_p(x))$, where p=0, . . . , $\lambda(x)$−1, of the locating set corresponding to that value of x, calculating, for i=0, . . . , 2l−1 and j=0, . . . , $\lambda_{max}$−1, where $\lambda_{max}$ is the maximum value of the cardinals $\lambda(x)$ of the erroneous aggregates, the extended error syndromes $\sigma_j(i) = <Y^j X^i | e>$, where e is a transmission error affecting r and $Y^j X^i$ represents the word of which the components are equal to the value taken by the monomial $Y^j X^i$ at the points of the locating set, implementing, for j=0, . . . , $\lambda_{max}$−1, by the error syndromes polynomial $$S_j(Z) = \sum_{i=0}^{2l-1} \sigma_j(i) Z^i,$$

an error correction algorithm adapted to Reed-Solomon codes, so as to calculate the errors $E_j(x)$ in the components of a Reed-Solomon codeword defined over the same Galois field as the algebraic geometric code which are labeled by the l values of x associated with an erroneous aggregate, and calculating, for each value of x such that there is at least one value j for which $E_j(x)$ is non-zero, the estimations ê(x, $y_p(x)$) of the respective errors in the components r(x,$y_p$(x)), where p=0, ..., λ(x)–1, of r by solving the system of equations $$E_j(x) = \sum_{p=0}^{\lambda(x)-1} [y_p(x)]^j \hat{e}(x, y_p(x)), \text{ where } j = 0, \ldots, \lambda(x) - 1.$$

2. A decoding method according to claim 1, in which the error correction algorithm adapted to Reed-Solomon codes is the Forney algorithm.

3. A decoding method according to claim 1 or claim 2, in which, if there is at least one value of x associated with an erroneous aggregate such that λ(x)<a, comparison is then made between the members of at least one equation $$E_j(x) = \sum_{p=0}^{\lambda(x)-1} [y_p(x)]^j \hat{e}(x, y_p(x)), \text{ where } \lambda(x) \leq j \leq a - 1,$$

associated with the value of x, after having calculated $E_j(x)$ by an error correction algorithm adapted to Reed-Solomon codes.

4. A decoding method according to claim 1 or claim 2, in which the calculation of the extended error syndromes $\sigma_j$(i)=<$Y^j X^i$|e> for i=0, ..., 2l–1 and j=0, ..., $\lambda_{max}$–1 comprises the following sub-steps:

calculating, for each value of j=0, ..., $\lambda_{max}$–1, a number or extended error syndromes $\sigma_j$(i) at least equal to the number l of erroneous aggregates, and calculating the extended error syndromes $\sigma_j$(i) for i=0, ..., 2l–1 and j=0, ..., $\lambda_{max}$–1 which have not yet been obtained, by recursion relationships using the error locating polynomial in x $$\Lambda(Z) = \prod_{t=1}^{l} (1 - Zx_t),$$

where the $x_t$ are the values of x associated with an erroneous aggregate.

5. A non-removable data storage device, comprising computer program code instructions for the execution of the steps of a method according to claim 1.

6. A partially or wholly removable data storage device, comprising computer program code instructions for the execution of the steps of a method according to claim 1.

7. A computer-readable medium storing a computer program, containing instructions such that, when said program controls a programmable data processing device, said instructions lead to said data processing device implementing a method according to claim 1.

8. A method of calculating errors in a received word for decoding the received word according to an algebraic geometric code defined on an algebraic curve, said method comprising the steps of:

determining a set of values of x appearing in points (x,y) associated with erroneous components of the received word, each of the values of x defining an erroneous aggregate;

calculating a predetermined number of extended syndromes associated with the received word;

calculating, for each erroneous aggregate, composite error values using the extended error syndromes, each composite error value representing a linear combination of the errors over the components of the erroneous aggregate;

calculating the error values over the components of the erroneous aggregates; and decoding the received word using the error values calculated over the components of the erroneous aggregates.

9. A computer-readable medium storing a computer program for controlling a computer, said program comprising codes for causing the computer to perform the method of calculating errors according to claim 8.

10. An error correction device for the decoding a one-point algebraic geometric code defined on an algebraic curve of the kind C(a,b) represented by an equation of degree b in X and of degree a in Y, said device comprising, for any received word r, means for identifying each point (x,y) of the locating set of the code such that the component of the received word r labeled by that point is erroneous, further comprising means for:

counting the number l of different values of x appearing in the points associated with erroneous components of r, each of the values of x defining an erroneous aggregate of which the elements are all the λ(x) points (x,$y_p$(x)), where p=0, ..., λ(x)–1, of the locating set corresponding to that value of x, calculating, for i=0, ..., 2l–1 and j=0, ..., $\lambda_{max}$–1, where $\lambda_{max}$ is the maximum value of the cardinals λ(x) of the erroneous aggregates, the extended error syndromes $\sigma_j$(i)=<$Y^j X^i$|e>, where e is the transmission error affecting r and $Y^j X^i$ represents the word of which the components are equal to the value taken by the monomial $Y^j X^i$ at the points of the locating set, implementing, for j=0, ..., $\lambda_{max}$–1, by the error syndromes polynomial $$S_j(Z) = \sum_{i=0}^{2l-1} \sigma_j(i) Z^i,$$

an error correction algorithm adapted to Reed-Solomon codes, so as to calculate the errors $E_j(x)$ in the of the components of a Reed-Solomon codeword defined over the same Galois field as the algebraic geometric code which are labeled by the l values of x associated with an erroneous aggregate, and calculating, for each value of x such that there is at least one value j for which $E_j(x)$ is non-zero, the estimations ê(x, $y_p(x)$) of the respective errors in the components r(x,$y_p$(x)), where p=0, ..., λ(x)–1, of r by solving the system of equations $$E_j(x) = \sum_{p=0}^{\lambda(x)-1} [y_p(x)]^j \hat{e}(x, y_p(x)), \text{ where } j = 0, \ldots, \lambda(x) - 1.$$

11. An error correction device according to claim 10, in which the error correction algorithm adapted to Reed-Solomon codes is the Forney algorithm.

12. An error correction device according to claim 10 or claim 11, comprising means for, if there is at least one value of x associated with an erroneous aggregate of cardinal $\lambda(x)<a$, comparing the members of at least one equation $$E_j(x) = \sum_{p=0}^{\lambda(x)-1} [y_p(x)]^j \hat{e}(x, y_p(x)), \text{ where } \lambda(x) \le j \le a-1,$$

associated with the value of x, after having calculated $E_j(x)$ by an error correction algorithm adapted to Reed-Solomon codes.

13. An error correction device according to claim 10 or claim 11, wherein, to perform the calculation of the extended error syndromes $\sigma_j(i)=<Y^j X^i|e>$ for $i=0, \ldots, 2l-1$ and $j=0, \ldots, \lambda_{max}-1$, said device comprises means for:
calculating, for each value of $j=0, \ldots, \lambda_{max}-1$, a number or extended error syndromes $\sigma_j(i)$ at least equal to the number l of erroneous aggregates, and
calculating the of the extended error syndromes $\sigma_j(i)$ for $i=0, \ldots, 2l-1$ and $j=0, \ldots, \lambda_{max}-1$ which have not yet been obtained, by recursion relationships using the error locating polynomial in x $$\Lambda(Z) = \prod_{t=1}^{l} (1 - Zx_t),$$

where the $x_t$ are the values of x associated with an erroneous aggregate.

14. A device for calculating errors in a received word for decoding the received word according to an algebraic geometric code defined on an algebraic curve, the device comprising:
determination means for determining a set of values of x appearing in points (x,y) associated with erroneous components of the received word, each of the values of x defining an erroneous aggregate;
syndrome calculation means for calculating a predetermined number of extended syndromes associated with the received word;
first error value calculation means for calculating, for each erroneous aggregate, composite error values using the extended error syndromes, each composite error value representing a linear combination of the errors over the components of erroneous aggregate;
second error value calculation means for calculating the error values over the components of the erroneous aggregates; and
decoding means for decoding the received word using the error values calculated over the components of the erroneous aggregates.

15. A decoder, comprising:
at least one device according to claim 8 or 14, and
at least one redundancy removal unit.

16. An apparatus for receiving encoded digital signals, comprising a decoder according to claim 15 and in means for demodulating the encoded digital signals.

17. A computer system, comprising a decoder according to claim 15 and:
at least one hard disk, and
at least one means for reading that hard disk.

* * * * *